United States Patent
Ahn et al.

(10) Patent No.: US 6,770,566 B1
(45) Date of Patent: Aug. 3, 2004

(54) METHODS OF FORMING SEMICONDUCTOR STRUCTURES, AND ARTICLES AND DEVICES FORMED THEREBY

(75) Inventors: Yongchul Ahn, Eagan, MN (US); Kaichiu Wong, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 38 days.

(21) Appl. No.: 10/151,127

(22) Filed: May 16, 2002

Related U.S. Application Data

(60) Provisional application No. 60/362,878, filed on Mar. 7, 2002, and provisional application No. 60/362,556, filed on Mar. 6, 2002.

(51) Int. Cl.$^7$ .............................................. H01L 21/302
(52) U.S. Cl. ...................................... 438/710; 438/70
(58) Field of Search .................................. 438/710, 720

(56) References Cited

U.S. PATENT DOCUMENTS

| | | | |
|---|---|---|---|
| 4,507,851 A | * | 4/1985 | Joyner et al. ................. 29/590 |
| 4,668,335 A | | 5/1987 | Mockler et al. |
| 4,862,243 A | | 8/1989 | Welch et al. |
| 4,920,403 A | | 4/1990 | Chow et al. |
| 4,945,397 A | | 7/1990 | Schuetz |
| 4,961,822 A | | 10/1990 | Liao et al. |
| 5,017,510 A | | 5/1991 | Welch et al. |
| 5,189,506 A | | 2/1993 | Cronin et al. |
| 5,221,424 A | | 6/1993 | Rhoades |
| 5,238,872 A | | 8/1993 | Thalapaneni |
| 5,256,597 A | | 10/1993 | Gambino |
| 5,300,813 A | | 4/1994 | Joshi et al. |
| 5,305,519 A | | 4/1994 | Yamamoto et al. |
| 5,395,796 A | | 3/1995 | Haskell et al. |
| 5,403,779 A | | 4/1995 | Joshi et al. |
| 5,426,330 A | | 6/1995 | Joshi et al. |
| 5,565,707 A | | 10/1996 | Colgan et al. |
| 5,585,673 A | | 12/1996 | Joshi et al. |
| 5,587,613 A | | 12/1996 | Iranmanesh |
| 5,696,619 A | | 12/1997 | Knipe et al. |
| 5,702,981 A | | 12/1997 | Maniar et al. |
| 5,726,497 A | | 3/1998 | Chao et al. |
| 5,745,990 A | | 5/1998 | Lee et al. |
| 5,747,380 A | | 5/1998 | Yu et al. |
| 5,756,397 A | | 5/1998 | Jun |
| 5,780,315 A | | 7/1998 | Chao et al. |
| 5,804,505 A | | 9/1998 | Yamada et al. |
| 5,866,945 A | | 2/1999 | Chen et al. |
| 5,888,898 A | | 3/1999 | Ngo et al. |
| 5,889,328 A | | 3/1999 | Joshi et al. |
| 5,904,556 A | | 5/1999 | Suzuki et al. |
| 5,925,933 A | | 7/1999 | Colgan et al. |
| 5,942,801 A | | 8/1999 | Tran |
| 5,958,798 A | | 9/1999 | Shields |
| 5,963,830 A | | 10/1999 | Wang et al. |
| 5,969,425 A | | 10/1999 | Chen et al. |
| 5,976,975 A | | 11/1999 | Joshi et al. |
| 6,030,891 A | | 2/2000 | Tran et al. |
| 6,043,152 A | | 3/2000 | Chang et al. |
| 6,066,555 A | | 5/2000 | Nulty et al. |
| 6,093,635 A | | 7/2000 | Tran et al. |
| 6,110,819 A | | 8/2000 | Colgan et al. |
| 6,133,139 A | | 10/2000 | Dalal et al. |
| 6,133,142 A | | 10/2000 | Tran et al. |
| 6,143,642 A | | 11/2000 | Sur, Jr. et al. |
| 6,147,402 A | | 11/2000 | Joshi et al. |
| 6,159,851 A | | 12/2000 | Chen et al. |
| 6,222,273 B1 | * | 4/2001 | Gonzalez et al. ............ 257/774 |
| 6,645,353 B2 | * | 11/2003 | Huff et al. .............. 204/192.32 |

* cited by examiner

*Primary Examiner*—Chandra Chaudhari
*Assistant Examiner*—David S. Blum
(74) *Attorney, Agent, or Firm*—Evan Law Group LLC

(57) ABSTRACT

A method of forming a semiconductor structure is described that includes etching a first metal layer at the bottom of a via in a first insulating layer to expose a second metal layer, wherein the first metal layer is on the second metal layer, and wherein the etching of the first metal layer is not reactive-ion etching. Methods of making semiconductor devices and electronic devices are also described.

20 Claims, 5 Drawing Sheets

(Typical Processing Steps)

(Typical Processing Steps)

(Typical Processing Steps)

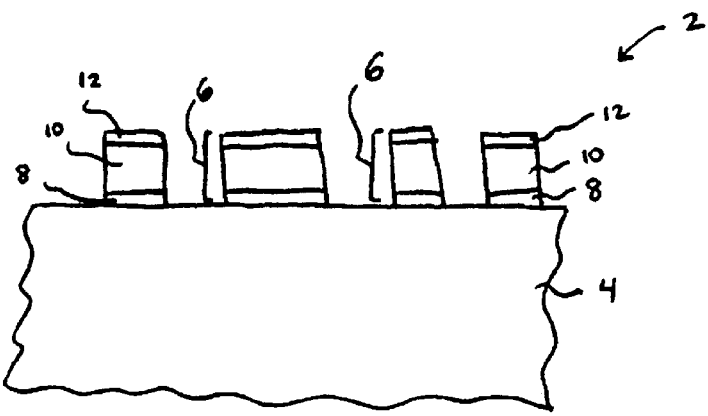
(Typical Processing Steps)
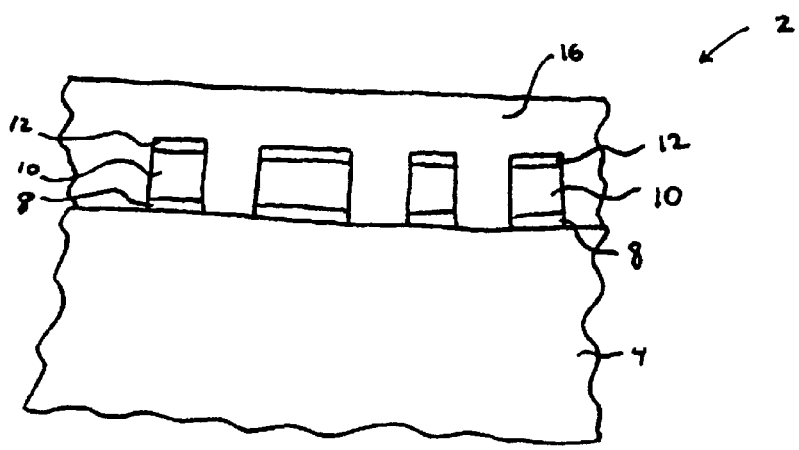
(Typical Processing Steps)
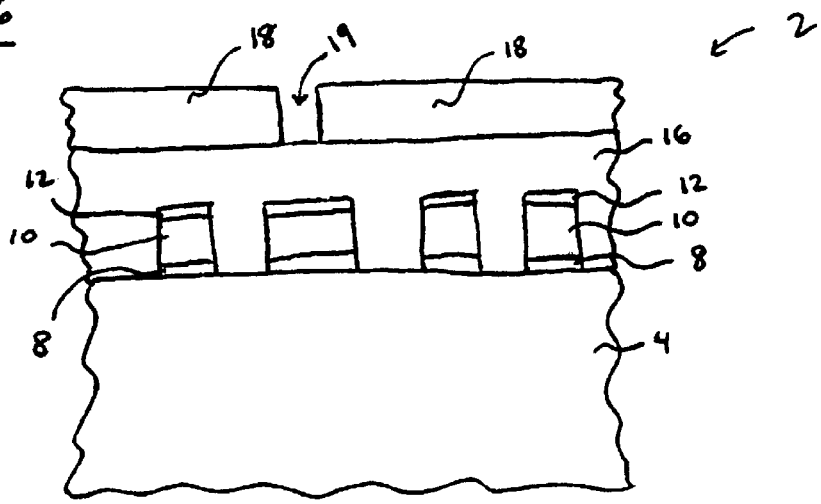
(Typical Processing Steps)

(Typical Processing Steps)

(Typical Processing Steps)

METHODS OF FORMING SEMICONDUCTOR STRUCTURES, AND ARTICLES AND DEVICES FORMED THEREBY

RELATED APPLICATIONS

This application claims priority under 35 U.S.C. § 119(e) to U.S. Provisional Patent Application Ser. No. 60/362,556 filed Mar. 6, 2002, and to U.S. Provisional Patent Application Ser. No. 60/362,878 filed Mar. 7, 2002. The entire contents of both provisional patent applications is incorporated herein by reference, except that in the event of any inconsistent disclosure or definition from the present application, the disclosure or definition herein shall be deemed to prevail.

BACKGROUND

This invention relates to the field of semiconductor technology and, more particularly, to the field of via-contacts.

Device densities and the number of components on semiconductor wafer surfaces have continued to increase in recent years. As a result, the surface areas available for wiring have decreased proportionately. One solution to this problem has been to design multilevel metallization structures, in which an insulating layer of dielectric material interposed between two metal layers is etched with via holes (also known as contact holes or plugs), which provide channels through the insulating layer for connecting the two metal layers. These channels may be filled with a conducting material (e.g., tungsten) to establish electrical contact between the metal layers.

Typical processing steps involved in the creation of a via are illustrated in FIGS. 1–8. The semiconductor structure 2 shown in FIG. 1 is made by forming an insulating layer 4 (e.g., an oxide layer) over a fabricated cell and peripheral circuitry (not shown). The insulating layer 4 may be deposited by chemical vapor deposition (CVD) and then planarized using chemical mechanical polishing (CMP). A first metal structure 6 may then be deposited over insulating layer 4. The first metal structure 6 may include a stacked metal structure, such as shown in FIG. 1, which includes a bottom layer 8, a middle layer 10, and a top layer 12. Typically, a refractory metal such as TiW is employed for bottom layer 8 and top layer 12. The refractory metal serves to prevent temperature-related hillock formation during subsequent processing, while enhancing electro- and stress-migration resistances and providing more reliable interconnections. Typically, a conducting metal such as aluminum or an aluminum alloy, which provides low resistivity interconnections, is employed as the middle layer 10.

The metal structure 6 is then patterned using photolithography and etching, as illustrated in FIGS. 2 and 3. A photoresist 14 may be deposited on the top layer 12 of stacked metal structure 6 and then patterned as shown in FIG. 2 to create mask openings 15. The top layer 12, the middle layer 10, and the bottom layer 8 of stacked metal structure 6 are then successively etched through mask openings 15 to create openings 17, as shown in FIG. 3.

The photoresist 14 is stripped away and the resulting structure is cleaned to provide the semiconductor structure 2 shown in FIG. 4. A second insulating layer 16 (e.g., an oxide layer) is then deposited on the patterned stacked metal structure 6 (e.g., using CVD) in a manner analogous to that described above. As before, the structure can be planarized (e.g., using CMP) to provide the semiconductor structure 2 shown in FIG. 5.

A via is formed in semiconductor structure 2 as illustrated in FIGS. 6–8. A second photoresist 18 may be deposited on second insulating layer 16 and patterned as described above to create a mask opening 19, as shown in FIG. 6. A via 20 may be etched through mask opening 19 using photolithography and dry etching. Removal of the photoresist 18 provides the semiconductor structure 2 shown in FIG. 7, which may then be filled with a metal such as aluminum (e.g., by the aluminum flow method) or with a stacked metal structure 24, as shown in FIG. 8, to complete the metallization process. The stacked metal structure 24 shown in FIG. 8 includes a top layer 30 (e.g., Co—Ti), a middle layer 28 (aluminum), and a bottom layer 26 (e.g., TiW).

The conventional technique of via formation (i.e., the process for converting the structure depicted in FIG. 6 to the structure depicted in FIG. 7) usually involves a dry etching process known as reactive ion etching (RIE), which exposes the middle layer 10 of aluminum to several potentially damaging influences, including radio frequency (RF) power damages and chemical attacks on the aluminum surface. As shown in FIG. 7, the top layer 12 of refractory metal is typically removed during reactive ion etching of the via, with the middle layer 10 of aluminum being damaged as a result. A gouge 22 in the aluminum is typically made, which serves to increase porosity and lower density, thus increasing the susceptibility of the aluminum to contamination from hydroxide ions (OH⁻) and hydroxide radicals (OH—) during wet chemical and water exposure.

The contaminated aluminum may have a detrimental effect on electrical contact with the second metal used to fill the via-contact. A porous interface or a void at the via-contact interface may result, which renders the via-contact readily susceptible to stress during reliability tests, and may lead to electrical degradation of the device, such as an increase in via-contact resistance. Furthermore, an open circuit may result from the disconnection of the two metal layers in the via-contact. FIG. 9 shows an SEM photograph of a stress-induced void formed at the interface of a via-contact after burn-in test.

The present invention is directed to providing high quality via-contacts ao exhibiting good structural integrity.

SUMMARY

The scope of the present invention is defined solely by the appended claims, and is not affected to any degree by the statements within this summary.

In a first aspect, the present invention is a method of forming a semiconductor structure that includes etching a first metal layer at the bottom of a via in a first insulating layer to expose a second metal layer, wherein the first metal layer is on the second metal layer, and wherein the etching of the first metal layer is not reactive-ion etching.

In a second aspect, the present invention is a method of making a semiconductor device that includes making a semiconductor structure by the method described above, and forming a semiconductor device from the structure.

In a third aspect, the present invention is a method of making an electronic device that includes making a semiconductor device by the method described above, and forming an electronic device that includes the semiconductor device.

BRIEF DESCRIPTION OF THE DRAWINGS

FIG. 4 shows a cross-sectional view of the semiconductor structure of FIG. 3 after removal of the photoresist.

FIG. 5 shows a cross-sectional view of the semiconductor structure of FIG. 4 after deposition and planarization of an insulating layer.

FIG. 6 shows a cross-sectional view of the semiconductor structure of FIG. 5 after deposition and patterning of a photoresist.

DETAILED DESCRIPTION

It has been discovered that high quality via-contacts exhibiting reduced tendency to form interfacial voids, and multilevel metallization structures incorporating the same, can be prepared by preserving all or a portion of a top metal layer of a stacked metal structure after completing the dry via etching of a cover layer on the top metal layer. This residual portion of top metal layer is removed via a physical etching process (e.g., by sputtering with a noble gas, such as argon), thereby preventing exposure of a metal layer (e.g., aluminum) beneath the top metal layer to damaging reactive ion etchants. Thus, the metal layer beneath the top metal layer is kept free from hydroxide ions (HO⁻) and hydroxide radicals (HO—) during subsequent exposure to water and wet chemicals.

A semiconductor structure 32 for use in accordance with and embodying features of the present invention is shown in FIGS. 10–13. A precursor to semiconductor structure 32, shown in FIG. 6, can be prepared as described above and as illustrated in FIGS. 1–6.

Figure 10:
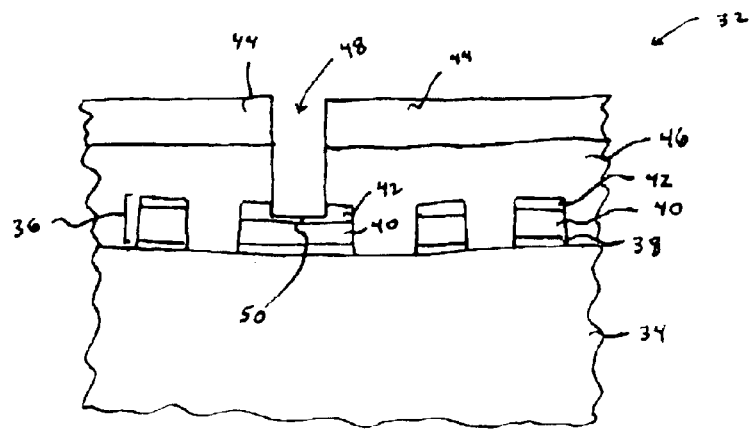
FIG. 10 shows a cross-sectional view of a semiconductor structure formed in accordance with and embodying features of the present invention.

The present invention includes removing all or a portion of the top layer of a stacked metal structure by a method other than reactive ion etching. Thus, as illustrated in FIG. 10, dry etching of a first cover layer 46 (e.g., an insulating layer such as oxide) through a photoresist 44 is terminated at a stage when a top layer 42 of a first stacked metal structure 36 has been only partially removed. Stacked metal structure 36 preferably includes top layer 42 and bottom layer 38, which are preferably refractory metals. Preferably, the top layer 42 has an initial thickness of at least 100 Angstroms (Å), more preferably at least 250 Å, and still more preferably at least 400 Å. Preferably, the amount of top layer 42 removed via dry etching does not exceed 99.9 percent of the initial thickness, more preferably does not exceed 97 percent of the initial thickness, still more preferably does not exceed 95 percent of the initial thickness.

Suitable refractory metals and metal alloys for use as top layer 42 and/or bottom layer 38 include but are not limited to TiW, Ti, W, Ta, Mo, Nb, $WSi_2$, $TaSi_2$, $MOSi_2$, $TiSi_2$, alloys thereof, and combinations thereof, with TiW being especially preferred. A TiW layer having a thickness of 500 Å is especially preferred for use as the top layer 42. Middle layer 40 is preferably a conducting material. Suitable conducting materials include but are not limited to aluminum, copper, aluminum alloys, copper alloys, and combinations thereof, with aluminum being especially preferred.

As depicted in FIG. 10, a residual portion 50 of top layer 42 remains in place following the etching of via 48. In alternative embodiments, the dry etching of cover layer 46 can be terminated at a stage when the top layer 42 of stacked metal structure 36 remains fully intact. In view of the desirability of terminating the dry etching of via 48 prior to exposing the middle layer 40 of stacked metal structure 36, it is preferred that the etching of the first cover layer 46 is achieved using either a timed etch by which etching is terminated at an end point determined according to the thickness of the layer or layers to be etched, or using a chemically selective etch by which the nest cover layer 46 is etched preferentially or exclusively in relation to the top layer 42.

Figure 11:
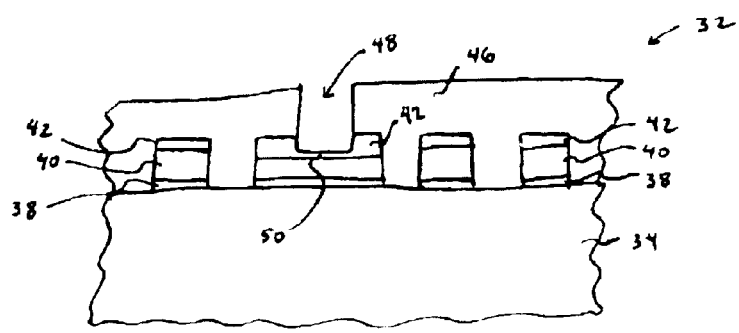
FIG. 11 shows a cross-sectional view of the semiconductor structure of FIG. 10 after photoresist stripping.

Optionally, after the etching of via 48, photoresist 44 may be removed and the structure cleaned to provide the semiconductor structure 32 shown in FIG. 11. Stripping and cleaning may be performed using wet chemicals, such as those available from EKC Technology Inc. (Danville, Calif.), and de-ionized water. It is noted that the residual portion 50 of top layer 42 prevents possible chemical attack upon and damage to middle layer 40.

Figure 12:
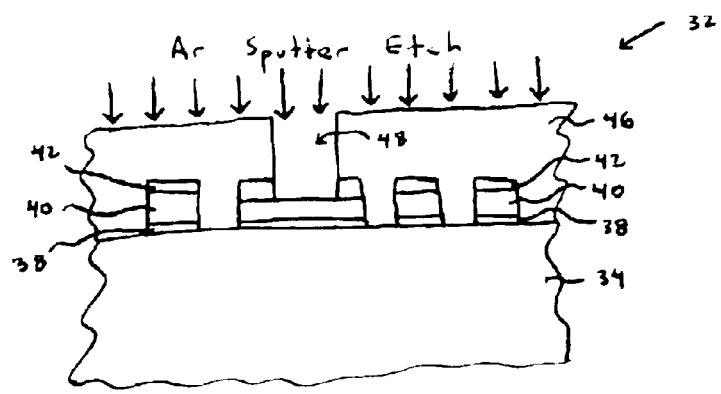
FIG. 12 shows a cross-sectional view of the semiconductor structure of FIG. 11 after removal of the residual top metal layer.

The residual portion 50 of top layer 42, having served its role of preserving the integrity of middle layer 40, is then removed using a physical etching process that does not involve reactive ion etching, such as is shown in FIG. 12. The removal of residual portion 50 improves via-contact resistance and facilitates the subsequent metallization process (e.g., aluminum flow method). Preferably, the physical etching process used to remove residual portion 50 is a dry etching process that does not utilize fluorine, chlorine, and/or oxygen. More preferably, the etching employs unreactive species such as inert gases or gases that do not form reactive species when in contact with middle layer 40. Still more preferably, the etching is a sputtering process that employs a noble gas, Argon is a preferred noble gas for use in such a sputtering process.

Figure 13:
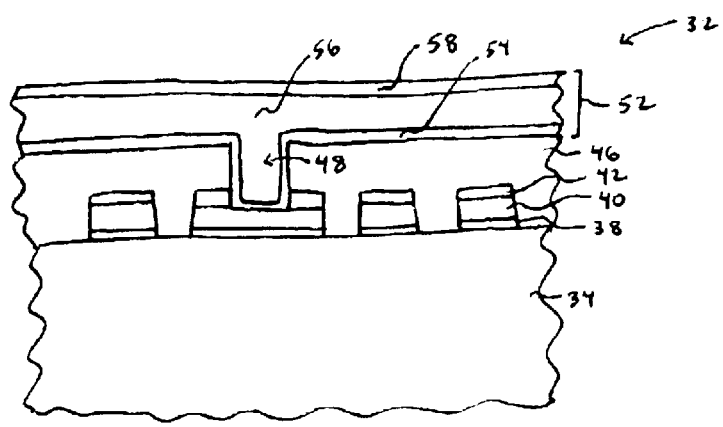
FIG. 13 shows a cross-sectional view of the semiconductor structure of FIG. 12 after via filling with a stacked metal structure.

After the residual portion 50 of top layer 42 has been removed, the via 48 may be filled with a conducting material, such as the stacked metal structure 52 shown in FIG. 13. Stacked metal structure 52 includes a top layer 58, a middle layer 56, and a bottom layer 54. Preferably, top layer 58 is a refractory metal having a thickness of at least 100 Å, more preferably at least 250 Å, and still more preferably at least 400 Å. A layer of TiW having a thickness of 500 Å is especially preferred. Preferably, middle layer 56 is a conducting material having a thickness of at least 2 kÅ, more preferably at least 5 kA, still more preferably at least 7 kÅ. A layer of aluminum having a thickness of 8 kÅ is especially preferred. Preferably, bottom layer 54 is a metal or metal alloy having a thickness of at least 50 Å, more preferably at least 100 Å, still more preferably at least 200 Å. A Co—Ti layer having a thickness of 300 Å is especially preferred.

Figure 1:
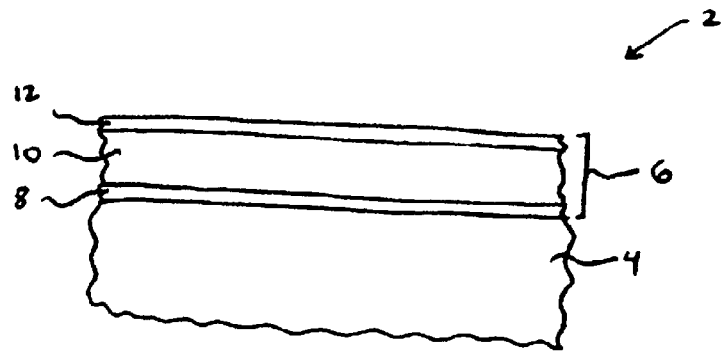
FIG. 1 shows a cross-sectonal view of a semiconductor structure.
Figure 2:
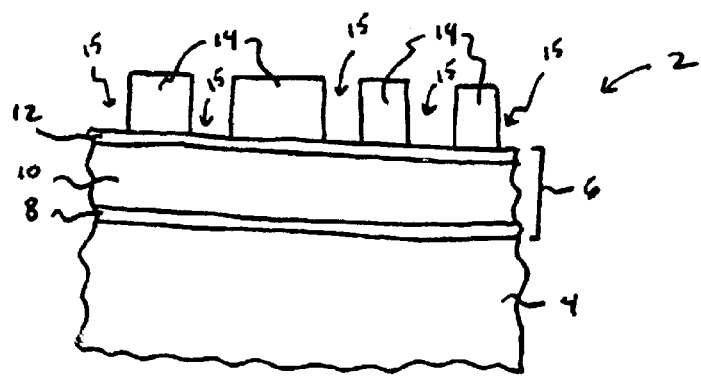
FIG. 2 shows a cross-sectional view of the semiconductor structure of FIG. 1 after deposition and patterning of a photoresist.
Figure 3:
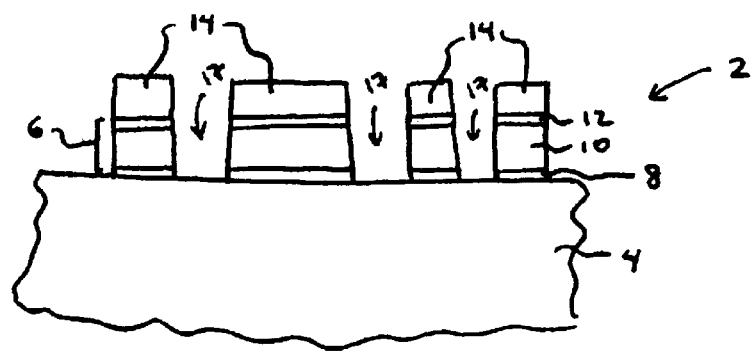
FIG. 3 shows a cross-sectional view of the semiconductor structure of FIG. 2 after etching of the stacked metal structure.
Figure 7:
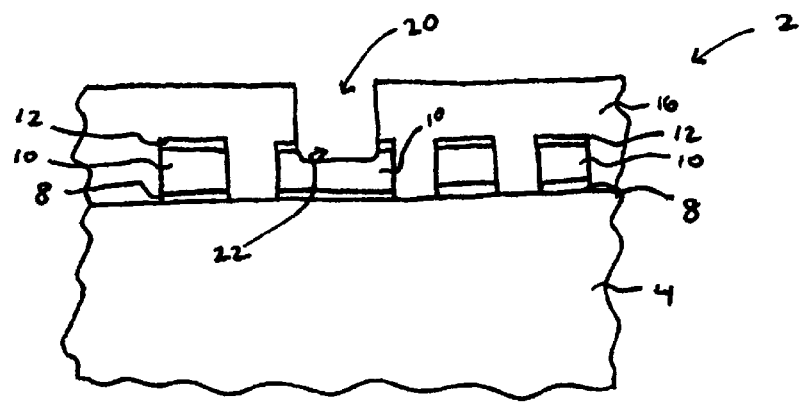
FIG. 7 shows a cross-sectional view of the semiconductor structure of FIG. 6 after via etching and photoresist stripping.
Figure 8:
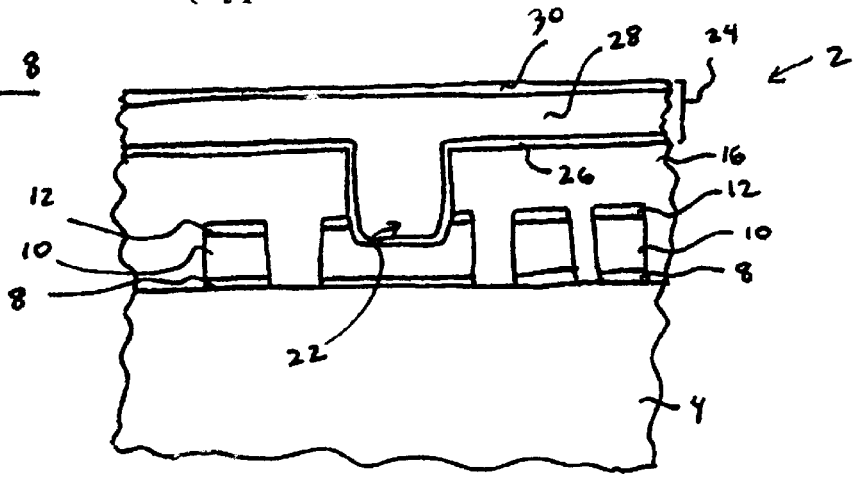
FIG. 8 shows a cross-sectional view of the semiconductor structure of FIG. 7 after via filling with a stacked metal structure.
Figure 9:
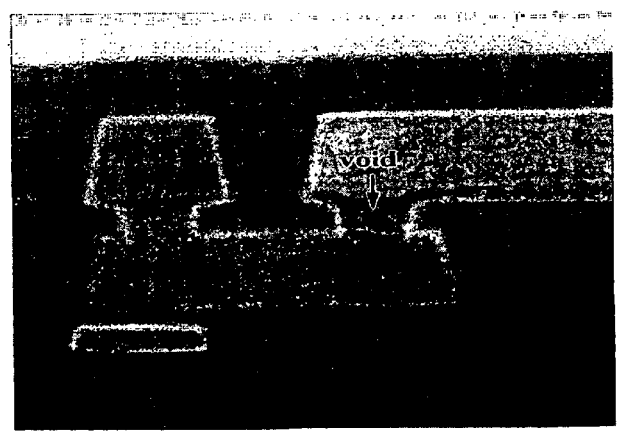
FIG. 9 shows an SEM photograph of a via-contact exhibiting a stress-induced interfacial void.
Figure 14:
FIG. 14 shows an SEM photograph of a via-contact formed in accordance with and embodying features of the present invention.

Via-contacts formed in accordance with arid embodying features of the present invention have contamination-free interfaces, and exhibit reduced frequency of void formation during processing and/or backend tests (e.g., burn-in test, pressure cooking test, etc.). Thus, the reliability of functional devices (e.g., DRAMs, SRAMS, microprocessors, etc.) incorporating via-contacts formed in accordance with and embodying features of the present invention is greatly improved. FIG. 14 shows a SEM photograph of a via-contact produced in accordance with the present invention following burn-in test. As is evident from this photograph, an undesirable void region of the type apparent in FIG. 9 has not been formed.

Table 1 shows backend Early Failure Rate (EFR) data collected after 6, 12, 24, 48, and 96 hours for lots processed using either conventional methods or methods embodying features of the present invention. Lots 1, 2, and 3 were subjected to conventional via-contact processing and then tested, while lots 4 and 5 were subjected to methods embodying features of the present invention prior to testing. As shown in Table 1, lots 4 and 5 exhibited no via void even after 96 hours failure. Lots TV1, TV2, and TV3 correspond to products fabricated in accordance with the present invention, which likewise exhibited no via void even after 96 hours failure.

TABLE 1

| Lot/Burn-in | 6 | 12 | 24 | 48 | 96 |
| --- | --- | --- | --- | --- | --- |
| 1 | 0 | 0 | 0 | 0 | 3 |
| 2 | 0 | 0 | 0 | 6 | 8 |
| 3 | 0 | 0 | 0 | 1 | 3 |
| 4 | 0 | 0 | 0 | 0 | 0 |
| 5 | 0 | 0 | 0 | 0 | 0 |
| TV1 | 0 | 0 | 0 | 0 | 0 |
| TV2 | 0 | 0 | 0 | 0 | 0 |
| TV3 | 0 | 0 | 0 | 0 | 0 |

TV = test vehicle

By way of illustration, representative procedures for making semiconductor structures in accordance with and embodying features of the present invention are provided below solely by way of illustration, and are not intended to limit the scope of the appended claims or their equivalents.

Table 2 shows representative process conditions for performing a via-contact mask etch (VIME) that is highly selective for oxide as compared to TiW. A highly selective VIME recipe is preferred for use in accordance with the present invention in order to allow control over whether the contact etch is terminated prior to etching through the TiW top layer, or is continued until the TiW top layer has been etched through and the underlying metal layer has been exposed. A highly selective VIME recipe is especially preferred when the thickness of the oxide layer to be removed varies across the wafer.

TABLE 2

| | VIME Recipe | | | |
| --- | --- | --- | --- | --- |
| Step Number | 1 | 2 | 3 | 4 |
| Name | Stabilization | ARC Etch | BLEND | Main Etch |
| Chamber selection | ABC-- | ABC--- | ABC--- | ABC--- |
| Step end control | Time | Time | Time | Time |
| Maximum step time | 10.0 sec | 147.0 sec | 4.0 sec | 140 sec |
| Endpoint selection | No | External | External | External |
| Pressure | 100 mTorr | 100 mTorr | 70 mTorr | 70 mTorr |
| RF power, match, mode | 0 W, Auto B-B | 500 W, Auto B-B | 500 W, Auto B-B | 500 W, Auto B-B |
| DC bias limit | −1000 to 0 V | −1000 to 0 V | −1000 to 0 V | −1000 to 0 V |
| Helium, Lift Position | 20.0 Torr, Proc1 | 20.0 Torr, Proc1 | 20.0 Torr, Proc1 | 20.0 Torr, Proc1 |
| Magnetic field | 0 | 0 | 0 | 0 |
| Magnet modulation | Programmed | Programmed | Programmed | Programmed |
| Degree of modulation | | | | |
| Magnetic Rot. Freq. | | | | |
| $CF_4$, sccm | 50 | 50 | 50 | 30 |
| $CHF_3$, sccm | 10 | 10 | 10 | 45 |
| $CH_3F$, sccm | | | | |
| $C_2H_2F_4$, sccm | | | | |
| $C_2H_2F_4$, sccm | | | | |
| $SF_6$, sccm | | | | |
| Ar, sccm | 20 | 20 | 20 | 110 |
| $N_2$, sccm | 5 | 5 | 5 | 10 |
| $_2$, sccm | | | | |

Table 3 shows representative process conditions for performing a second metal deposition including an argon sputter etch prior to metal deposition into the via, which removes silicon dioxide with about 450 Å. The argon sputter etch removes remaining TiW in the via uniformly.

TABLE 3

Second Metal Deposition

| Step Number | Parameter | Temp |
|---|---|---|
| 1 | DEGAS 350 | |
| 2 | Ar sputter etch, 450 A (450 A referenced from silicon dioxide) | |
| 3 | COTI Cool for 300 A | |
| 4 | Aluminum HOT for 4000 A | 480° C. |
| 5 | Aluminum H-ESC for 4000 A | 450° C. |
| 6 | TIW HAL 300 A | |
| 7 | COOL DOWN | |

Table 4 shows additional representative process conditions for performing an argon sputter etch embodying features of the present invention.

TABLE 4

Argon Sputter Etch

| Step Number | 1 | 2 | 3 | 4 | 5 | 6 |
|---|---|---|---|---|---|---|
| Name | PUMP | GAS | IGNITE | ETCH | RAMP | PUMP |
| Chamber selection | A | A | A | A | A | A |
| Step end control | By time | By time | By time | Linear by time | By time | By time |
| Maximum step time | 1 sec | 10 sec | 5 sec | 180 sec | 2 sec | 5 sec |
| Pressure | No press. Control | No press. Control | No press. Control | No press. Control | No press. Control | No press. Control |
| RF power and match | 0 W, Auto | 0 W, Auto | 50 W, Auto | 315 W, Auto | 1 W, Auto | 0 W, Auto |
| DC bias fault limit | −1000, 0 V | −1000, 0 V | −1000, 0 V | −400, −300 V | −1000, 0 V | −1000, 0 V |
| DC bias warn limit | −1000, 0 V | −1000, 0 V | −1000, 0 V | −1000, 0 V | −1000, 0 V | −1000, 0 V |
| RF second power | 0 W | 0 W | 100 W | 225 W | 100 W | 0 W |
| Process position | Process Pump | Process | Process | Process | Process | Process Pump |
| Gas names and flows | | Ar. 5 ARH: 50 | Ar. 5 ARH: 20 | Ar. 5 | Ar. 5 | |

*ARH (high-pressure Ar) and unit = sccm

A semiconductor structure produced in accordance with and embodying features of the present invention may undergo additional processing in order to produce semiconductor devices and electronic devices incorporating such semiconductor devices. For example, source/drain regions, gates, gate dielectric layers, and the like may be formed on the semiconductor substrate to make transistors, which may be connected together through dielectric layers by contacts and metallization layers. Such additional elements may be formed before, during, or after formation of the inventive structures.

Structures embodying features of and produced in accordance with the present invention may be incorporated into a great variety of semiconductor devices, including but not limited to: integrated circuits (e.g., memory cells such as SRAM, DRAM, EPROM, EEPROM, and the like); programmable logic devices; data communications devices; clock generation devices; and so forth. Furthermore, any of these semiconductor devices may itself be incorporated into a multitude of electronic devices, including but not limited to computers, automobiles, airplanes, satellites, and the like.

Numerous additional variations in the presently preferred embodiments illustrated herein will be determined by one of ordinary skill in the art, and remain within the scope of the appended claims and their equivalents. For example, while the examples provided herein relate to silicon-based semiconductor structures, it is contemplated that alternative semiconductor materials can likewise be employed in accordance with the present invention, and that the semiconductor structures may be undoped, P-doped, or N-doped. Suitable semiconductor materials include but are not limited to silicon, gallium arsenide, germanium, gallium nitride, aluminum phosphide, $Si_{1-x}Ge_x$ and $Al_xGa_{1-x}As$ alloys, wherein x is greater than or equal to zero and less than or equal to one, the like, and combinations thereof. Additional examples of semiconductor materials for use in accordance with the present invention are set forth in *Semiconductor Device Fundamentals* by Robert F. Pierret (p. 4, Table 1.1, Addison-Wesley, 1996).

The individual semiconductor processing steps used in accordance with the present invention (e.g., etching, CVD, etc.) are well known to those of ordinary skill in the art, and are also described in numerous publications and treatises, including: *Encyclopedia of Chemical Technology*, Volume 14 (Kirk-Othmer, 1995, pp. 677–709); *Semiconductor Device Fundamentals* by Robert F. Pierret (Addison-Wesley, 1996); *Silicon Processing for the VLSI Era* by Wolf (Lattice Press, 1986, 1990, 1995, vols 1–3, respectively); and *Microchip Fabrication: A Practical Guide to Semiconductor Processing* by Peter Van Zant (4th Edition, McGraw-Hill, 2000).

Obviously, numerous modifications and variations of the present invention are possible in light of the above teachings. It is therefore to be understood that within the scope of the appended claims, the invention may be practiced otherwise than as specifically described herein.

What is claimed is:

1. A method of forming a semiconductor structure, comprising:
   etching a first insulating layer on a first metal layer to expose the first metal layer and form a via in the first insulating layer; and
   etching a residual portion of the first metal layer at the bottom of the via to expose a second metal layer, wherein the first metal layer is on the second metal layer, the etching of the residual portion of the first metal layer is not reactive-ion etching, and the etching of the residual portion of the first metal layer is etching with a plasma formed from a gas, and the gas does not comprise fluorine or chlorine.

2. The method of claim 1 wherein the etching of the first metal layer comprises sputtering.

3. The method of claim 2 wherein the gas comprises a noble gas.

4. The method of claim 3 wherein the noble gas comprises argon.

5. The method of claim 1 wherein the first metal layer comprises a refractory metal or a refractory metal alloy.

6. The method of claim 5 wherein the first metal layer comprises Ti and W.

7. The method of claim 1 further comprising dry etching an insulating cover layer, wherein the insulating cover layer is on the first metal layer.

8. The method of claim 7 wherein the dry etching is a selective VIME, and wherein the insulating cover layer is etched selectively.

9. The method of claim 1 wherein the second metal layer comprises aluminum.

10. The method of claim 1 wherein the semiconductor structure further comprises a third metal layer, wherein the second metal layer is on the third metal layer, and wherein the first metal layer, the second metal layer, and the third metal layer form a stacked metal structure.

11. The method of claim 10 wherein the first metal layer and the third metal layer comprise Ti and W, and the second metal layer comprises aluminum.

12. The method of claim 1 further comprising:

removing a photoresist before etching the first metal layer to expose the second metal layer.

13. The method of claim 10, further comprising filling the via with a conducting material to form a via-contact, wherein the conducting material comprises a stacked metal structure comprising a fourth metal layer, a fifth metal layer, and a sixth metal layer, wherein the fourth metal layer is on the second metal layer, the fifth metal layer is on the fourth metal layer, and the sixth metal layer is on the fifth metal layer.

14. The method of claim 13 wherein the fourth metal layer comprises Co and Ti, the fifth metal layer comprises aluminum, and the sixth metal layer comprises Ti and W.

15. A method of forming a semiconductor structure, comprising:

dry etching a first insulating layer to expose a first top layer of a first stacked metal structure, wherein the first stacked metal structure comprises the first top layer, a first middle layer, and a first bottom layer, and whereby the dry etching forms a via;

etching the first top layer using argon sputtering to expose the first middle layer; and filling the via with a conducting material to form a via-contact.

16. The method of claim 15 wherein the conducting material comprises a second stacked metal structure.

17. The method of claim 16 wherein:

the first top layer and the first bottom layer comprise Ti and W, and the first middle layer comprises aluminum; and the second stacked metal structure comprises a second bottom layer, a second middle layer on the second bottom layer, and a second top layer on the second middle layer, wherein the second bottom layer comprises Ti and W, the second middle layer comprises aluminum, and the second top layer comprises Co and Ti.

18. A method of making a semiconductor device comprising:

making a semiconductor structure by the method of claim 1; and forming a semiconductor device from the structure.

19. A method of making an electronic device comprising:

making a semiconductor device by the method of claim 18; and forming an electronic device, which comprises the semiconductor device.

20. In a method of forming a via-contact that includes performing a first etch through an insulating layer and a first metal layer, performing a second etch through a residual portion of the first metal layer to expose a second metal layer below the first metal layer, and filling the via with a conducting material to form the via-contact, the improvement comprising performing the second etch not by reactive ion etching, wherein the second etch comprises aragon sputtering.

* * * * *